(12) United States Patent
Buller et al.

(10) Patent No.: US 10,153,386 B2
(45) Date of Patent: Dec. 11, 2018

(54) PHOTOVALTAIC DEVICE CONDUCTING LAYER

(71) Applicant: First Solar, Inc., Perrysburg, OH (US)

(72) Inventors: Benyamin Buller, Sylvania, OH (US); Akhlesh Gupta, Sylvania, OH (US)

(73) Assignee: First Solar, Inc., Perrysburg, OH (US)

( * ) Notice: Subject to any disclaimer, the term of this patent is extended or adjusted under 35 U.S.C. 154(b) by 344 days.

(21) Appl. No.: 14/699,574

(22) Filed: Apr. 29, 2015

(65) Prior Publication Data

US 2015/0236173 A1    Aug. 20, 2015

Related U.S. Application Data

(62) Division of application No. 13/107,222, filed on May 13, 2011, now abandoned.

(60) Provisional application No. 61/334,411, filed on May 13, 2010.

(51) Int. Cl.
*H01L 31/00* (2006.01)
*H01L 31/0296* (2006.01)
*H01L 31/0232* (2014.01)
*H01L 31/18* (2006.01)
*H01L 31/0224* (2006.01)

(52) U.S. Cl.
CPC .... *H01L 31/02963* (2013.01); *H01L 31/0232* (2013.01); *H01L 31/022466* (2013.01); *H01L 31/1828* (2013.01); *H01L 31/1864* (2013.01); *H01L 31/1884* (2013.01)

(58) Field of Classification Search
CPC ................................. H01L 31/02963
See application file for complete search history.

(56) References Cited

U.S. PATENT DOCUMENTS

| | | | |
|---|---|---|---|
| 4,207,119 A * | 6/1980 | Tyan | H01L 31/073 136/258 |
| 2003/0180983 A1 | 9/2003 | Oswald et al. | |
| 2005/0224111 A1 | 10/2005 | Cunningham et al. | |
| 2005/0257824 A1 | 11/2005 | Maltby et al. | |
| 2005/0271827 A1 | 12/2005 | Krunks et al. | |
| 2006/0065299 A1 | 3/2006 | Fukawa et al. | |
| 2008/0115821 A1 | 5/2008 | Xu et al. | |
| 2008/0223430 A1 | 9/2008 | Krasnov et al. | |
| 2008/0308411 A1 * | 12/2008 | Guo | C23C 14/0063 204/192.15 |
| 2009/0126791 A1 | 5/2009 | Lu et al. | |
| 2009/0194166 A1 | 8/2009 | Powell et al. | |
| 2009/0293945 A1 | 12/2009 | Peter | |
| 2010/0243046 A1 | 9/2010 | Degroot et al. | |

FOREIGN PATENT DOCUMENTS

JP    61-141185 A    6/1986

OTHER PUBLICATIONS

Wen et al., Transport Properties of Copper-Doped Indium Oxide and Indium Tin Oxide Ceramics, phys.stat.sol (a) 130, 4-7 (1992).*

(Continued)

*Primary Examiner* — Shannon M Gardner
(74) *Attorney, Agent, or Firm* — MacMillan, Sobanski & Todd, LLC

(57) ABSTRACT

A multilayered structure may include a doped buffer layer on a transparent conductive oxide layer.

16 Claims, 3 Drawing Sheets

(56) References Cited

OTHER PUBLICATIONS

Nakada et al., "Novel Device Structure for Cu(In,Ga)Se2 Thin Film Solar Cells Using Transparent Conducting Oxide Back and Front Contacts," Solar Energy, vol. 77, pp. 739-747, 2004.
Office Action dated Oct. 8, 2014 in corresponding Chinese Patent Application No. 201180023893.6.
Office Action dated May 4, 2015 in corresponding Chinese Patent Application No. 201180023893.6.
Zhao et al., "Introduction of Sb in CDTE and its Effects on CDTE Solar Cells", 978-1-4244-1641-07/08, 2008 IEEE.
Indian Office Action, Application No. 10620/DELNP/2012, dated Jun. 12, 2018.

\* cited by examiner

PHOTOVALTAIC DEVICE CONDUCTING LAYER

CLAIM OF PRIORITY

This is a division of application Ser. No. 13/107,222, filed May 13, 2011, which claims priority under 35 U.S.C. § 119(e) to U.S. Provisional Patent Application Ser. No. 61/334,411 filed on May 13, 2010, both of which are hereby incorporated by reference in their entirety.

TECHNICAL FIELD

The present invention relates to photovoltaic devices and methods of production.

BACKGROUND

Photovoltaic devices can include semiconductor material formed over a substrate, for example, with a first layer serving as a window layer and a second layer serving as an absorber layer. Current photovoltaic devices are inefficient.

DETAILED DESCRIPTION

Figure 1:
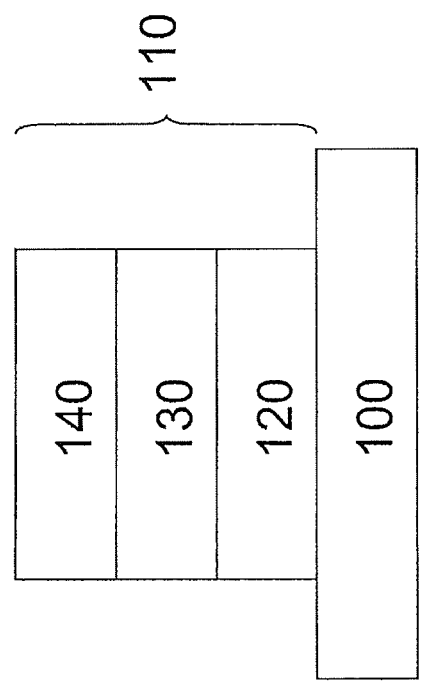
FIG. 1 is a schematic of a multilayered substrate.

Photovoltaic devices can include multiple layers created on a substrate (or superstrate). For example, a photovoltaic device can include a barrier layer, a transparent conductive oxide (TCO) layer, a buffer layer, and a semiconductor layer formed in a stack on a substrate. Each layer may in turn include more than one layer or film. For example, the semiconductor layer can include a first film including a semiconductor window layer, such as a cadmium sulfide layer, formed on the buffer layer and a second film including a semiconductor absorber layer, such as a cadmium telluride layer formed on the semiconductor window layer. Additionally, each layer can cover all or a portion of the device and/or all or a portion of the layer or substrate underlying the layer. For example, a "layer" can include any amount of any material that contacts all or a portion of a surface.

Photovoltaic devices may include a semiconductor bi-layer, which may include a cadmium telluride layer on a cadmium sulfide layer. For photovoltaic devices including cadmium telluride, device efficiency may be improved by increasing the carrier concentration of the cadmium telluride bulk. Existing methods of increasing carrier concentration of cadmium telluride bulk have involved incorporating external dopants, such as copper, into the back contact layer. For example, a photovoltaic device may include a doped back contact, such as a copper-doped molybdenum. Alternatively, the buffer layer of the TCO stack may be doped prior to annealing of the completed stack. For example, a photovoltaic device may include a copper-doped tin oxide layer. A photovoltaic device manufactured with a copper-doped tin oxide buffer 10 layer can exhibit improved device performance, including, for example, improved open circuit voltage. For example, a photovoltaic device including a copper-doped tin oxide buffer layer can exhibit an open circuit voltage of more than about 750 V, including, for example, an open circuit voltage in a range of about 770 V to about 850 V. The copper-doped buffer layer and the transparent conductive oxide layer can be deposited using a variety of suitable techniques, including, for example, sputtering and atmospheric pressure chemical vapor deposition (APCVD). Alternative dopants, for example, arsenic or antimony, may yield similar results. For example, a photovoltaic device may include an arsenic-doped or antimony-doped buffer layer adjacent to a TCO layer or stack.

In one aspect, a multilayered structure can include a barrier layer adjacent to a substrate, a transparent conductive oxide layer adjacent to the barrier layer, and a buffer layer including a dopant adjacent to the transparent conductive oxide layer. The dopant can include copper, arsenic, or antimony. The doped buffer layer can include tin oxide, zinc oxide, zinc stannate, zinc magnesium oxide, or tin silicon oxide. The doped buffer layer can include multiple layers. One of the multiple layers can include a doped layer, and another one of the multiple layers can be an undoped layer, and the doped layer can be adjacent to the undoped layer. The doped buffer layer can have a dopant concentration of more than about $1 \times 10^{15}/cm^2$. The doped buffer layer can include a tin oxide and has a dopant to tin oxide ratio of about $10^{-5}$ to about $10^1$. The multilayered structure can include a semiconductor window layer adjacent to the doped buffer layer, wherein the semiconductor window layer comprises a material selected from the group consisting of cadmium sulfide, zinc sulfide, cadmium zinc sulfide, and zinc magnesium oxide. The multilayered structure can include a semiconductor absorber layer adjacent to the doped buffer layer, wherein the semiconductor absorber layer comprises a material selected from the group consisting of cadmium telluride, zinc telluride, and cadmium zinc telluride. The multilayered structure can have a carrier concentration of greater than about $1 \times 10^{14}/cm^3$.

In another aspect, a method of manufacturing a multilayered structure can include forming a doped buffer layer adjacent to a transparent conductive oxide layer. The transparent conductive oxide layer can be adjacent to a substrate. The method can include forming a semiconductor window layer adjacent to the buffer layer. The method can include forming a semiconductor absorber layer adjacent to the semiconductor window layer. The method can include heating the multilayered structure to a temperature sufficient to diffuse dopant from the buffer layer into the semiconductor absorber layer.

The step of heating the multilayered structure can include heating the multilayered structure to a temperature greater than 300 degrees C., greater than 450 degrees C., greater than 600 degrees C., or greater than 750 degrees C. The dopant can include a material selected from the group consisting of copper, arsenic, and antimony. The method can include forming the transparent conductive oxide layer adjacent to the substrate before forming the doped buffer layer. The step of forming a doped buffer layer can include co-sputtering buffer layer material and dopant from separate sputter targets. The buffer layer material can include tin and the dopant can include a material selected from the group consisting of copper, arsenic, and antimony. The step of forming a doped buffer layer can include foaming a buffer layer adjacent to the transparent conductive oxide layer and doping the buffer layer with a dopant.

The doped buffer layer has more than about $1 \times 10^{15}/cm^2$ of copper. The step of forming a doped buffer layer can include a reactive sputtering process. The step of forming a doped buffer layer can include atmospheric pressure chemical vapor deposition. The method can include an additional step of heating the transparent conductive oxide layer, and buffer layer to anneal the multilayer structure.

In another aspect, a photovoltaic device can include a barrier layer adjacent to a substrate, a transparent conductive oxide layer adjacent to the barrier layer, a buffer layer can include a dopant adjacent to the transparent conductive oxide layer, a semiconductor window layer adjacent to the buffer layer, a semiconductor absorber layer adjacent to the semiconductor window layer, wherein the semiconductor absorber layer comprises a portion of the dopant, diffused from the buffer layer, and a back contact adjacent to the semiconductor absorber layer. The dopant can include copper, arsenic, or antimony. Dopant diffused from the buffer layer to the semiconductor absorber layer can be present in a substantially uniform concentration proximate to the buffer layer.

In another aspect, a sputter target can include a sputter material including tin and copper, arsenic, or antimony. A sputter target can include a stainless steel tube. The sputter material can be connected to the stainless steel tube to form a sputter target. The sputter material can include a tin oxide. The sputter material can have a copper to tin ratio of about $10^{-6}$ to about $5 \times 10^{-2}$. The sputter target can include a ceramic tin oxide and copper. The sputter target can include a bonding layer bonding the sputter material and the backing tube.

In another aspect, a method of manufacturing a sputter target can include forming a sputter material including tin and copper, arsenic, or antimony, and attaching the sputter material to a backing tube to foam a sputter target. The step of attaching the sputter material to a backing tube to form a sputter target can include a thermal spray forming process. The step of attaching the sputter material to a backing tube to form a sputter target can include a plasma spray forming process. The step of attaching the sputter material to a backing tube to four a sputter target can include a powder metallurgy process. The powder metallurgy process can include a hot press process. The powder metallurgy process can include an isostatic process. The step of attaching the sputter material to a backing tube to form a sputter target can include a flow forming process. The step of attaching the sputter material to the backing tube can include bonding the sputtering material to the backing tube with a bonding layer.

In another aspect, a photovoltaic module can include a plurality of photovoltaic cells adjacent to a substrate and a back cover adjacent to the plurality of photovoltaic cells. Each one of the plurality of photovoltaic cells can include a barrier layer adjacent to the substrate, a transparent conductive oxide layer adjacent to the barrier layer, a buffer layer including a dopant adjacent to the transparent conductive oxide layer, a semiconductor window layer adjacent to the buffer layer, a semiconductor absorber layer adjacent to the semiconductor window layer, wherein the semiconductor absorber layer includes a portion of the dopant, diffused from the buffer layer, and a back contact adjacent to the semiconductor absorber layer. The photovoltaic module can include a plurality of positive and negative electrical lines configured to electrically connect the photovoltaic cells to a positive lead and a negative lead. The photovoltaic module can include a positive bus bar and negative bus bar configured to electrically connect the photovoltaic cells to a positive lead and a negative lead. The positive lead and negative lead can be configured to electrically connect the photovoltaic module to at least on additional photovoltaic module to foam a photovoltaic array.

In another aspect, a method for generating electricity, the method can include illuminating a photovoltaic cell with a beam of light to generate a photocurrent, and collecting the generated photocurrent. The photovoltaic cell can include a barrier layer adjacent to the substrate, a transparent conductive oxide layer adjacent to the barrier layer, a buffer layer including a dopant adjacent to the transparent conductive oxide layer, a semiconductor window layer adjacent to the buffer layer, a semiconductor absorber layer adjacent to the semiconductor window layer, wherein the semiconductor absorber layer includes a portion of the dopant, diffused from the buffer layer, and a back contact adjacent to the semiconductor absorber layer. The generated photocurrent can comprise direct current and can be converted to alternating current.

Referring to FIG. 1, by way of example, barrier layer 120 may be formed adjacent to substrate 100. Barrier layer 120 and subsequent layers can be formed by any suitable method. Barrier layer 120 and subsequent layers can be deposited, for example, by sputtering, physical vapor deposition, chemical vapor deposition, or any other suitable deposition process. Substrate 100 may include any suitable material, including, for example, a glass. The glass may include a soda-lime glass, or any glass with reduced iron content. The glass may undergo a treatment step, during which one or more edges of the glass may be substantially rounded. The glass may have any suitable transmittance, including about 450 nm to about 800 nm. The glass may also have any suitable transmission percentage, including, for example, more than about 50%, more than about 60%, more than about 70%, more than about 80%, or more than about 85%. For example, substrate 100 may include a glass with about 90% transmittance.

Barrier layer 120 may be deposited in the presence of one or more gases, for example, an oxygen gas. An argon gas may be added to the deposition chamber to increase the rate of deposition. For example, barrier layer 120 may include a silicon aluminum oxide sputtered in the presence of an oxygen/argon gas mix. The incorporation of argon into the deposition process can result in a higher deposition rate for barrier layer 120.

Barrier layer 120 may include any suitable material, including, for example, an aluminum-doped silicon oxide, silicon oxide, silicon nitride, or aluminum oxide. Barrier layer 120 can be incorporated between the substrate and the TCO layer to lessen diffusion of sodium or other contaminants from the substrate to the semiconductor layers, which could result in degradation or delamination. Barrier layer 120 can be transparent, thermally stable, with a reduced number of pin holes and having high sodium-blocking capability, and good adhesive properties. Barrier layer 120 can include any suitable number of layers and may have any suitable thickness, including, for example, more than about 500 A, more than about 750 A, or less than about 1200 A. For example, barrier layer 120 may have a thickness of about 1000 A.

A transparent conductive oxide layer 130 can be formed adjacent to barrier layer 120. Transparent conductive oxide layer 130 may be deposited using any suitable means, including, for example, sputtering or atmospheric pressure chemical vapor deposition. Like barrier layer 120, transparent conductive oxide layer 130 may be deposited by incorporating argon gas into the deposition environment, which can allow for higher deposition rates than deposition without an argon gas environment. For example, transparent conductive oxide layer 130 may be deposited in the presence of an oxygen/argon gas mix. An argon content in barrier layer 120 and transparent conductive oxide layer 130 may be detectable following deposition. For example, barrier layer 120 or transparent conductive oxide layer 130 can either or both include argon in an amount of 1-10,000 ppm, for example, 10-1,000 ppm.

Transparent conductive oxide layer 130 may include any suitable material, including, for example, an amorphous layer of cadmium stannate, aluminum-doped zinc oxide, or fluorine-doped tin oxide. Transparent conductive oxide layer 130 may have any suitable thickness, including, for example, more than about 2000 A, more than about 2500 A, or less than about 3000 A. For example, transparent conductive oxide layer 130 may have a thickness of about 2600 A.

A buffer layer 140 may be formed adjacent to transparent conductive oxide layer 130. Buffer layer 140 can be deposited between the TCO layer and a semiconductor window layer to decrease the likelihood of irregularities occurring during the formation of the semiconductor window layer. Buffer layer 140 may include any suitable material, including, for example, an amorphous tin oxide, zinc tin oxide, zinc oxide, tin silicon oxide, or zinc magnesium oxide, as well as zinc stannate. Buffer layer 140 may have any suitable thickness, including, for example, more than about 500 A, more than about 650 A, more than about 800 A, or less than about 1200 A. For example, buffer layer 140 may have a thickness of about 900 A. Buffer layer 140 may be deposited using any suitable means, including, for example, sputtering. For example, buffer layer 140 may include a tin oxide sputtered in the presence of an oxygen gas. Buffer layer 140, along with barrier layer 120 and transparent conductive oxide layer 130; can form transparent conductive oxide stack 110.

Buffer layer 140 may include one or more dopants to improve device efficiency. For example, buffer layer 140 may include a tin oxide with a copper dopant. Buffer layer 140 may include any suitable concentration of copper. For example, buffer layer 140 may include a copper concentration of more than about $1 \times 10^{15}/cm^2$. Buffer layer 140 may include any suitable ratio of copper to tin oxide. For example, buffer layer 140 may include a copper to tin oxide ratio of more than about $10^{-5}$, more than about $10^{-4}$, less than about $10^4$, or less than about $10^{-2}$.

Buffer layer 140 may include multiple layers. For example, buffer layer 140 may include two layers, with a first undoped layer; and a second doped layer adjacent thereto, doped with a dopant such as copper, arsenic, or antimony. Any suitable dopant or combination of dopants can be included in the doped buffer layer. For example, buffer layer 140 may contain an arsenic or antimony dopant, which, like copper, may diffuse into the subsequent semiconductor absorber layer during a high-temperature thermal process. The configuration of buffer layer 140 may improve the carrier concentration of the photovoltaic device. For example, a photovoltaic device having a cadmium telluride absorber layer and buffer layer 140 may have an improved carrier concentration greater than about $1 \times 10^{14}/cm^3$. During exposure of the photovoltaic device to a high-temperature thermal process (e.g., the deposition of a cadmium telluride absorber layer, or during a separate annealing process) copper from a copper-doped buffer layer 140 may diffuse into the subsequently formed cadmium telluride absorber layer, thereby increasing carrier concentration of the resulting photovoltaic device. In one embodiment, a substrate comprising a barrier layer 120, transparent conductive oxide layer 130, and buffer layer 140 is provided. A doped buffer layer as described above can be formed adjacent to buffer layer 140, which can be provided in an undoped state.

Buffer layer 140 may be deposited using any suitable technique, including, for example, sputtering or atmospheric pressure chemical vapor deposition. Buffer layer 140 may be sputtered from a sputter target including any suitable sputter material, including, for example, a material including a combination of tin and copper. A sputter target for buffer layer 140 may include a sputter material including any suitable copper to tin ratio. For example, a sputter target for buffer layer 140 may include a sputter material including a copper to tin ratio of more than about $10^{-6}$, more than about $10^{-5}$, less than about $5 \times 10^{-2}$, less than about $10^{-2}$, or less than about $10^{-3}$. A sputter target for barrier layer 140 may include a backing tube, which may include any suitable material, including, for example, stainless steel. The sputter material may be connected to the backing tube to form the sputter target for buffer layer 140. The sputter target for buffer layer 140 may include a bonding layer for bonding the sputter material to the backing tube. The sputter target for buffer layer 140 may be configured to use in any suitable reactive sputtering process. Multiple sputter targets may be used for the deposition of buffer layer 140. For example, buffer layer 140 may be deposited from separate copper and tin (or tin oxide) sputter targets.

A sputter target may include any suitable material, including, for example, tin, tin oxide, copper, arsenic, antimony, or any combination thereof. A sputter target can be manufactured by ingot metallurgy. A sputter target can be manufactured as a single piece in any suitable shape. A sputter target can be a tube. A sputter target can be manufactured by casting a material into any suitable shape, such as a tube.

A sputter target can be manufactured from more than one piece. For example, a sputter target can be manufactured from more than one piece, such as a piece of tin and a piece of copper, or a piece of tin oxide and a piece of copper. The pieces can be manufactured in any suitable shape, such as sleeves, and can be joined or connected in any suitable manner or configuration. For example, a piece of tin and a piece of copper can be welded together to form a sputter target for a buffer layer; a piece of silicon and a piece of aluminum can be welded together to form a sputter target for a barrier layer; and a piece of cadmium and a piece of tin can be welded together to form a sputter target for a transparent conductive oxide layer. One sleeve can be positioned within another sleeve.

A sputter target can be manufactured by powder metallurgy. A sputter target can be formed by consolidating powder (e.g., silicon and aluminum for the barrier target; cadmium and tin for the transparent conductive oxide target; or tin and copper, or tin oxide and copper, for the buffer target) to form the target. The powder can be consolidated in any suitable process (e.g., pressing such as isostatic pressing) and in any suitable shape. The consolidating can occur at any suitable temperature. A sputter target can be formed from powder including more than one material powder (e.g., tin and copper, silicon and aluminum, or cadmium and tin). More than one powder can be present in stoichiometrically proper amounts.

Sputter targets (including rotary sputter targets) can include a sputter material used in connection with a backing material. The backing material can include stainless steel. The backing material can include a backing tube. The backing material can include a stainless steel backing tube. The tube can be of any suitable size, including, for example, about 9 to 11 feet by about 5 to 7 inches. The sputter target can include bonding layers applied to the tube surface before application of the sputter material.

A sputter target can be manufactured by positioning wire including target material adjacent to a base. For example, wire including target material can be wrapped around a base tube. The wire can include multiple materials (e.g., tin and copper for a buffer layer) present in stoichiometrically proper amounts. The base tube can be formed from a material that will not be sputtered. The wire can be pressed (e.g., by isostatic pressing).

A sputter target can be manufactured by spraying a sputter material onto a base. Sputter material can be sprayed using any suitable spraying process, including thermal spraying and plasma spraying. The sputter material can include multiple materials (e.g., tin and copper, or tin oxide and copper), present in stoichiometrically proper amounts. The base onto which the target material is sprayed can include a tube.

A sputter target can be manufactured by dissolving an alloy in an acid. The alloy may include any suitable materials, including, for example, tin and copper. The dissolved metal alloy may then be bonded to the outside of a stainless steel tube. The bond between the tube and the metal alloy can be of a substantially high strength. The sputter targets can be substantially uniform. The sputter target can be manufactured using various suitable techniques, including, for example, casting, which may consist of melting the alloy, pouring it into a mold, and then cooling it quickly. Alternatively, the sputter target may be formed using any suitable powder metallurgy technique, which may include grinding and spraying the precursor materials.

A sputter target can include any suitable ratio of materials. For example, the sputter target can include a sputter material which has a copper to tin ratio of more than about $10^{-6}$, more than about $10^{-5}$, less than about $5 \times 10^{-2}$, less than about $10^{-2}$, or less than about $5 \times 10^{-3}$. The sputter target can include a ceramic tin oxide:copper target. A copper-doped tin oxide buffer layer may also be co-sputtered from separate tin and copper targets.

The layers included in the structure and photovoltaic device can be created using any suitable technique or combination of techniques. For example, the layers can be formed by low pressure chemical vapor deposition, atmospheric pressure chemical vapor deposition, plasma-enhanced chemical vapor deposition, thermal chemical vapor deposition, DC or AC sputtering, spin-on deposition, and spray-pyrolysis. Each deposition layer can be of any suitable thickness, for example in the range of about 1 to about 5000 A.

The deposition rate of the TCO stack may be expedited by incorporating an argon gas into the deposition chamber, in addition to oxygen gas. For example, the barrier and/or TCO layer can be sputtered in the presence of an oxygen/argon gas mix to facilitate the deposition process. An aluminum-doped silicon oxide can be deposited onto a glass substrate, which may include any suitable glass, including, for example, soda-lime glass or any glass with a reduced iron content. The glass may have one or more rounded edges to enable the substrate to withstand high anneal temperatures (e.g., about 600 degrees C.). The TCO layer may have a low roughness to facilitate smooth cadmium sulfide deposition, thereby resulting in greater control of the cadmium sulfide/cadmium telluride junction interface. The sheet resistance of the TCO layer may be controlled by monitoring the cell width. The TCO layer, which may include a cadmium tin oxide, for example, may be deposited on the aluminum-doped silicon oxide, in the presence of an oxygen/argon gas mix. The incorporation of argon during the sputtering of the aluminum-doped silicon oxide and the cadmium tin oxide can increase the deposition rate by a factor of about 2.

Figure 3:
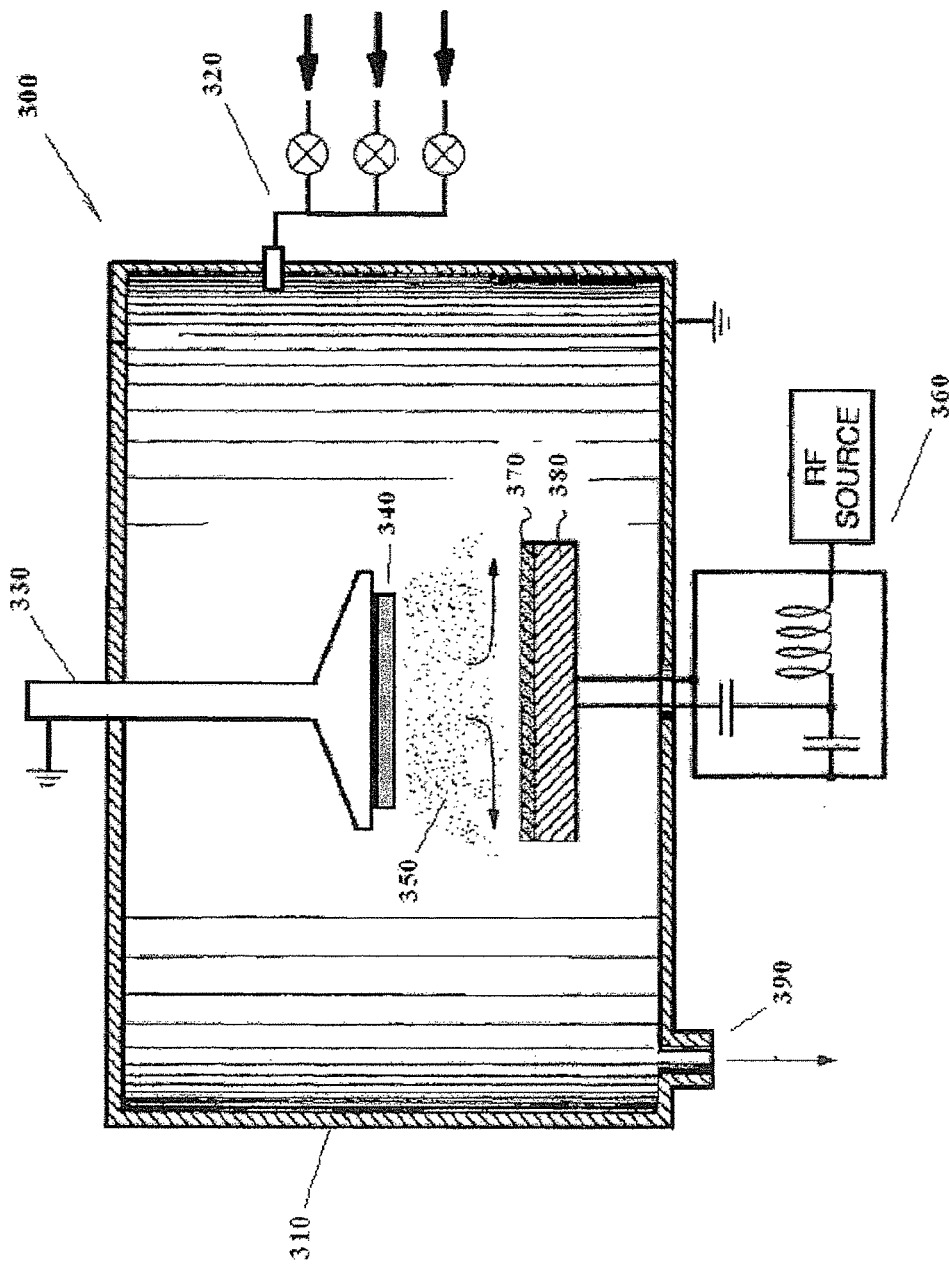
FIG. 3 is a schematic of a sputter deposition chamber.

Referring to FIG. 3, a sputter system 300 may include a chamber 310 and radio-frequency or direct current source and matching circuit 360. Substrate 370, which may include any suitable substrate material, including, for example, a glass, including, for example, a soda-lime glass, may be mounted on a plate 380 or positioned in any other suitable manner. A grounded fixture 330 can hold sputter target 340 facing down. The gas in chamber 310 can be taken from an inlet 320 with sources of various suitable gas. The gas in chamber 310 can include argon. During the sputtering process, particles 350 can be deposited from target 340 to substrate 370. The sputtering process can include a reactive sputtering process. The gas in chamber 310 can further include any suitable dopant gas, including, for example, boron, sodium, fluorine, or aluminum. System 300 may include outlet 390 to exhaust gas.

Figure 2:
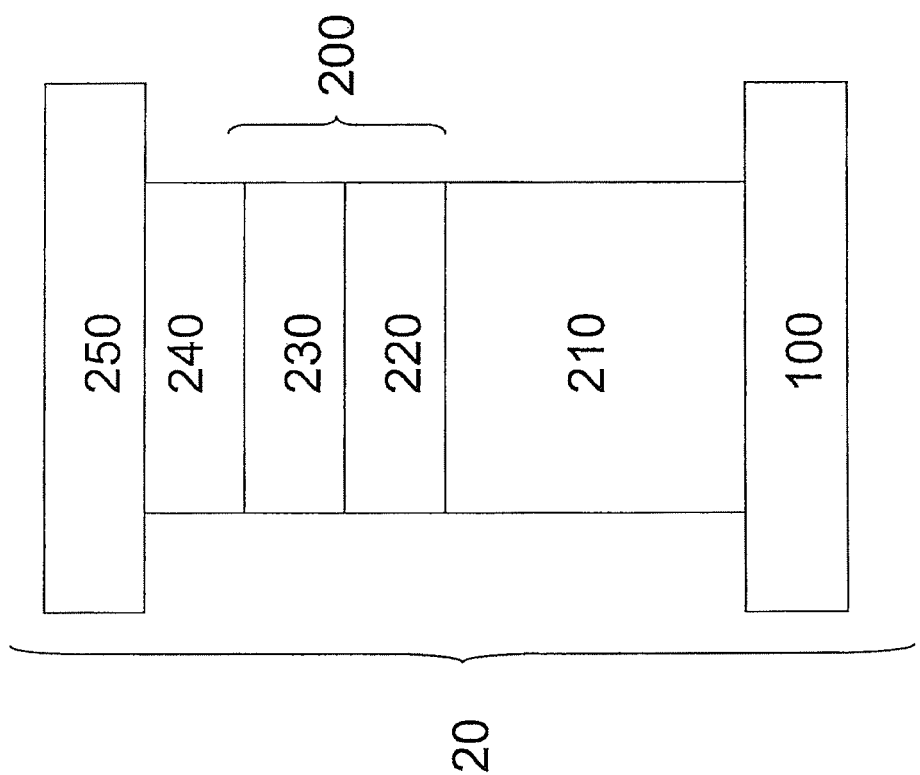
FIG. 2 is a schematic of a photovoltaic device having multiple layers.

Following deposition, transparent conductive oxide stack 110 can be annealed to form annealed stack 210 from FIG. 2. Transparent conductive oxide stack 110 can be annealed using any suitable annealing process. The annealing can occur in the presence of a gas selected to control an aspect of the annealing, for example, nitrogen gas. Transparent conductive oxide stack 110 can be annealed under any suitable pressure, for example, under reduced pressure, in a low vacuum, or at about 0.01 Pa ($10^{-4}$ Torr). Transparent conductive oxide stack 110 can be annealed at any suitable temperature or temperature range. For example, transparent conductive oxide stack 110 can be annealed above about 380 degrees C., above about 400 degrees C., above about 500 degrees C., above about 600 degrees C., or below about 800 degrees C. For example, transparent conductive oxide stack 110 can be annealed at about 400 degrees C. to about 800 degrees C. or about 500 degrees C. to about 700 degrees C. Transparent conductive oxide stack 110 can be annealed for any suitable duration. Transparent conductive oxide stack 110 can be annealed for more than about 10 minutes, more than about 20 minutes, more than about 30 minutes, or less than about 40 minutes. For example, transparent conductive oxide stack 110 can be annealed for about 15 to about 20 minutes.

Annealed transparent conductive oxide stack 210 can be used to form photovoltaic device 20 from FIG. 2. A semiconductor layer 200 can be formed adjacent to annealed transparent conductive oxide stack 210 (or adjacent to transparent conductive oxide stack 110 from FIG. 1). Semiconductor layer 200 can include a semiconductor window layer 220 and a semiconductor absorber layer 230. Semiconductor window layer 220 can include any suitable material, including, for example, cadmium sulfide, zinc sulfide, cadmium zinc sulfide, and zinc magnesium oxide. Semiconductor window layer 220 can be foamed directly on annealed transparent conductive oxide stack 210 (or on transparent conductive oxide stack 110 from FIG. 1). Semiconductor window layer 220 can be deposited using any known deposition technique, including vapor transport deposition. Semiconductor absorber layer 230 can be formed adjacent to semiconductor window layer 220. Semiconductor absorber layer 230 can include any suitable material, including, for example, cadmium telluride, zinc telluride, and cadmium zinc telluride. Semiconductor absorber layer 230 can be formed using any known deposition technique, including, for example, vapor transport deposition. Semiconductor window layer 220 can include a cadmium sulfide layer. Semiconductor absorber layer 230 can include a cadmium telluride layer.

Following deposition of semiconductor window layer 220 and semiconductor absorber layer 230, photovoltaic device 20 may be annealed, during which process, copper from a copper-doped buffer layer 140 from FIG. 1 may diffuse into semiconductor absorber layer 230, thereby increasing the carrier concentration of photovoltaic device 20. This anneal can be a separate anneal process from the TCO stack anneal. Alternatively, the deposition of semiconductor absorber layer 230, itself, may suffice to facilitate the diffusion of copper from buffer layer 140 into semiconductor absorber layer 230. For example, semiconductor absorber layer 230 may be formed at a substantially high temperature, including, for example, above about 300 degrees C., above about 450 degrees C., above about 600 degrees C., above about 750 degrees C., or less than about 800 degrees C.

Referring back to FIG. 1, the semiconductor window and absorber layers may also be formed adjacent to buffer layer 140, without a separate annealing process for transparent conductive oxide stack 110. For example, following deposition of buffer layer 140, the semiconductor window and absorber layers may be formed using a high-temperature deposition process, such as vapor transport deposition. The high-temperature deposition process may result in the diffusion of copper from a copper-doped buffer layer 140, for example, into the semiconductor absorber layer, which may include cadmium telluride. The diffusion of copper into the semiconductor absorber layer can increase carrier concentration of the resulting photovoltaic device. Similarly, the photovoltaic device may be annealed following formation of the semiconductor window and absorber layers, during which process, the copper may diffuse from a copper-doped buffer layer 140 into the subsequently formed semiconductor absorber layer, thereby improving the carrier concentration of the photovoltaic device. A back contact layer may be formed adjacent to the semiconductor absorber layer.

Referring back to FIG. 2, by way of example, a back contact 240 can be formed adjacent to semiconductor layer 200. Back contact 240 can be formed adjacent to semiconductor absorber layer 230. Back contact 240 may include any suitable material, including, for example, molybdenum, and can be formed using any suitable technique, including, for example, sputtering. A back support 250 can be formed adjacent to back contact 240. Back support 250 can include any suitable material, including, for example, glass (e.g., soda-lime glass).

The embodiments described above are offered by way of illustration and example. It should be understood that the examples provided above may be altered in certain respects and still remain within the scope of the claims. It should be appreciated that, while the invention has been described with reference to the above preferred embodiments, other embodiments are within the scope of the claims.

What is claimed is:

1. A method of manufacturing a multilayered structure, the method comprising:
  forming a doped buffer layer adjacent to a transparent conductive oxide layer, wherein the transparent conductive oxide layer is adjacent to a substrate;
  forming a semiconductor absorber layer on the doped buffer layer;
  heating the multilayered structure to a temperature sufficient to diffuse dopant from the doped buffer layer into the semiconductor absorber layer; and
  diffusing dopant from the doped buffer layer into the semiconductor absorber layer;
  wherein the doped buffer layer has more than about $1\times10^{15}/cm^2$ of dopant, and the semiconductor absorber layer has a carrier concentration of greater than $1\times10^{14}$ $cm^{-3}$ after the diffusing.

2. The method of claim 1, wherein the step of heating the multilayered structure comprises heating the multilayered structure to a temperature greater than 300 degrees C.

3. The method of claim 1, wherein the step of heating the multilayered structure comprises heating the multilayered structure to a temperature greater than 450 degrees C.

4. The method of claim 1, wherein the step of heating the multilayered structure comprises heating the multilayered structure to a temperature greater than 600 degrees C.

5. The method of claim 1, wherein the step of heating the multilayered structure comprises heating the multilayered structure to a temperature greater than 750 degrees C.

6. The method of claim 1, wherein the dopant comprises a material selected from the group consisting of copper, arsenic, and antimony.

7. The method of claim 1, further comprising forming the transparent conductive oxide layer adjacent to the substrate before forming the doped buffer layer.

8. The method of claim 1, wherein the step of forming a doped buffer layer comprises co-sputtering buffer layer material and dopant from separate sputter targets.

9. The method of claim 4, wherein the doped buffer layer material comprises tin and the dopant comprises a material selected from the group consisting of copper, arsenic, and antimony.

10. The method of claim 1, wherein the step of forming a doped buffer layer comprises forming a buffer layer adjacent to the transparent conductive oxide layer and doping the buffer layer with a dopant.

11. The method of claim 1, wherein the step of forming a doped buffer layer comprises a reactive sputtering process.

12. The method of claim 1, wherein the step of forming a doped buffer layer comprises atmospheric pressure chemical vapor deposition.

13. The method of claim 1, further comprising an additional step of heating the transparent conductive oxide stack comprising the transparent conductive oxide layer to anneal the transparent conductive oxide stack.

14. A method of manufacturing a multilayered structure, the method comprising:
  forming a doped buffer layer adjacent to a transparent conductive oxide layer, wherein the transparent conductive oxide layer is adjacent to a substrate;
  forming a semiconductor absorber layer on the doped buffer layer, wherein the semiconductor absorber layer comprises cadmium telluride;
  heating the multilayered structure to a temperature sufficient to diffuse dopant from the buffer layer into the semiconductor absorber layer; and
  diffusing dopant from the doped buffer layer into the semiconductor absorber layer;
  wherein the dopant comprises arsenic; and
  wherein the semiconductor absorber layer has a carrier concentration of greater than $1\times10^{14}$ $cm^{-3}$ after the diffusing.

15. A method of manufacturing a multilayered structure, the method comprising:
  forming a doped buffer layer adjacent to a transparent conductive oxide layer, wherein the transparent conductive oxide layer is adjacent to a substrate;
  forming a semiconductor absorber layer on the doped buffer layer, wherein the semiconductor absorber layer comprises cadmium telluride;

heating the multilayered structure to a temperature sufficient to diffuse dopant from the buffer layer into the semiconductor absorber layer; and diffusing dopant from the doped buffer layer into the semiconductor absorber layer;

wherein the dopant comprises antimony; and wherein the semiconductor absorber layer has a carrier concentration of greater than $1 \times 10^{14}$ cm$^{-3}$ after the diffusing.

16. The method of claim 1, wherein the doped buffer layer comprises amorphous tin oxide, zinc tin oxide, zinc oxide, tin silicon oxide, zinc magnesium oxide, or zinc stannate.

* * * * *